USOO5583801A

United States Patent [19]
Croyle et al.

[11] Patent Number: 5,583,801
[45] Date of Patent: Dec. 10, 1996

[54] VOICE TROUBLESHOOTING SYSTEM FOR COMPUTER-CONTROLLED MACHINES

[75] Inventors: Gene F. Croyle, Plano, Tex.; Conrad L. Fernandez, Charlotte, N.C.

[73] Assignee: Levi Strauss & Co., San Francisco, Calif.

[21] Appl. No.: 503,035

[22] Filed: Jul. 17, 1995

Related U.S. Application Data

[63] Continuation of Ser. No. 104,716, Aug. 11, 1993, abandoned.

[51] Int. Cl.⁶ .................................. G05B 19/02
[52] U.S. Cl. .................. 364/580; 364/551.01; 395/2.67
[58] Field of Search ............... 364/424.03, 424.04, 364/483, 506, 508, 550, 551.01, 551.02, 580, 188; 381/51, 52; 395/2.79; 371/15.1, 16.2; 324/114, 115

[56] References Cited

U.S. PATENT DOCUMENTS

| | | | |
|---|---|---|---|
| 4,420,813 | 12/1983 | Inoue et al. | 364/513 |
| 4,459,673 | 7/1984 | Shibazaki et al. | 364/513.5 |
| 4,465,003 | 8/1984 | Makabe et al. | 112/158 |
| 4,500,971 | 2/1985 | Futaki et al. | 381/51 X |
| 4,519,027 | 5/1985 | Vogelsberg | 364/185 |
| 4,563,770 | 1/1986 | Lemelson et al. | 381/51 |
| 4,622,647 | 11/1986 | Sagnard et al. | 364/580 |
| 4,694,408 | 9/1987 | Zaleski | 364/551.01 |
| 4,766,529 | 8/1988 | Nakano et al. | 395/2.79 X |
| 4,785,408 | 11/1988 | Britton et al. | 395/2.79 |
| 4,809,200 | 2/1989 | Moore et al. | 364/551.02 X |
| 4,821,217 | 4/1989 | Jackson et al. | 364/551.01 |
| 4,829,579 | 5/1989 | Harada et al. | 381/51 |
| 4,872,195 | 10/1989 | Leonard | 379/40 |
| 4,885,707 | 12/1989 | Nichol et al. | 364/551.01 |
| 4,949,274 | 8/1990 | Hollander et al. | 395/2.79 X |
| 5,001,745 | 3/1991 | Pollock | 381/52 X |
| 5,003,477 | 3/1991 | Abe et al. | 364/551.01 |
| 5,005,129 | 4/1991 | Abe et al. | 364/551.01 |
| 5,036,479 | 7/1991 | Prednis et al. | 364/580 |
| 5,068,814 | 11/1991 | Stark et al. | 364/580 |
| 5,115,406 | 5/1992 | Zatezalo et al. | 364/506 |
| 5,206,818 | 4/1993 | Speranza | 364/550 |
| 5,432,705 | 7/1995 | Severt et al. | 364/483 |

*Primary Examiner*—Emanuel T. Voeltz
*Assistant Examiner*—Eric W. Stamber
*Attorney, Agent, or Firm*—Medlen & Carroll, LLP

[57] ABSTRACT

A trouble-shooting system for computer-controlled machinery includes a portable programmable testing unit. The unit includes: a CPU; A/D and D/A converters connecting the CPU to a voltage probe, for either measuring voltages on the machine or generating test voltages to be applied to the machine; a voice synthesizer with headphones, and a text line display, for instructing the user; a keypad for the user to respond; a card slot for accepting a memory card which holds the test program; and a data bus connector. The data bus from the machine's control computer is disconnected for the test and coupled to the testing unit, which tests the computer as well as electro-mechanical devices of the machine. The card may be dedicated to the machine and contain a maintenance history.

21 Claims, 3 Drawing Sheets

VOICE TROUBLESHOOTING SYSTEM FOR COMPUTER-CONTROLLED MACHINES

This is a Continuation of application Ser. No. 08/104,716 filed on Aug. 11, 1993, now abandoned.

FIELD OF THE INVENTION

The present invention relates to equipment for trouble-shooting computer-controlled electro-mechanical machines, where the equipment provides verbal instructions to guide the technician who performs the trouble-shooting tests.

BACKGROUND OF THE INVENTION

The recent advent of computer-controlled machinery has created a need for highly skilled technicians who can diagnose malfunctions of both the electro-mechanical parts of the machinery and also the computer which controls it. Today, repair technicians must be skilled in mechanics, electric machines and electricity as before, and now also skilled in digital electronics. There is a shortage of such highly-skilled technicians.

Even a skilled technician may take a long time to diagnose a problem if he or she is not familiar with the particular piece of equipment needing repair. In a manufacturing plant where various machines need attention, it may be difficult for the repair personnel to know them all well enough to perform efficient trouble-shooting.

If repair technicians are not highly skilled for repairing a particular machine, then programmed repair guides may be provided to direct them through all the required tests needed to diagnose or repair that machine. These guides might take the form of outlines, printed instruction sets, flowcharts, and the like. The instruction set may be printed on paper, recorded on magnetic tape, or recorded in some other way.

The simplest kind of instruction set is that for a simple sequence of tests, one step at a time, to a technician. For more sophisticated machinery a flowchart-type instruction set may be best. With a flowchart the test sequence branches depending on the test result.

A flowchart instruction set may be physically presented in the same ways as a simple sequence, but if the flowchart is complex, then a computer, microprocessor, or CPU (central processing unit) with digital memory may be the best choice for holding the instruction set. The instructions are electronically loaded into the memory; physical interfaces and programs are provided for the technician to interact with the CPU to negotiate the flowchart.

The interface between the instruction set flowchart and the technician has two directions of information flow. First, the instructions stored in the memory must be verbalized, either visually or audibly, and presented to the technician. The program may also include non-verbal instruction aids, such as maps or diagrams which can be viewed on the computer screen. Second, the technician must be able to step through the program by sending digital messages to the CPU. A standard personal computer with video monitor can be used for holding the instruction set. The instructions stored in memory can be written on the screen, and the keyboard used to prompt the CPU to step or branch through the flowchart program.

The instruction set might pose questions, ask for specific data, or give directions, to enable the flowchart branches to be negotiated: for example, "If the voltage is higher than 25 volts, go to step 7", "Is the voltage above 25?", or "enter the voltage."

How the flowchart instruction set is written depends upon the number of inputs to the computer. For example, if only "yes" and "no" buttons are provided for the technician to communicate to the computer, a flowchart branch point might contain the instruction, "Is the voltage higher than 25 volts?" If a number keypad is provided for the technician, then the instruction at the same point might be, "Enter the voltage on the keypad."

With computerized or digital guides, the technician need not keep track of where in the flowchart the testing is; the CPU only provides the current instruction, and no others.

While a standard personal computer is expensive, fragile, bulky and immobile, a smaller computerized guide can be less bulky than books and charts.

In the case of a computer-controlled machine, malfunctions could be caused by the electrical and mechanical parts of the machine, or by the control computer, or by some interaction between the control computer and the electro-mechanical parts. The prior art has not addressed the problem of troubleshooting computer-controlled machinery. It has utilized various repair strategies and equipment, but has not shown any combination of these strategies and equipment which optimizes their repair.

Most industrial machines are electro-mechanical. They have mechanical parts which are powered or controlled by electricity. A sewing machine, for instance, usually has an electric motor, and may include sensors, step motors, solenoids, etc.

Testing an electro-mechanical machine usually requires a voltmeter to measure the electric tension at various points in the machine. Testing may also require a voltage or current generator, which provides, rather than detects, an electric signal. The generated voltage can be applied to various points in the machine to drive particular devices or sub-parts. A generator may produce pulses of electricity as well as steady direct current.

A technician usually will use a "probe" to apply or sample voltages at points of a machine or circuit. Such a probe usually consists of a metal spike which is mounted on an insulating handle and is electrically connected to a meter or generator by a flexible wire.

Where the machine under test includes a control computer, the machine will typically include circuits for "translating" between the electricity of the devices and the digital signals of the computer. These circuits are called "A/D" (Analog to Digital) converters and "D/A" (Digital to Analog) converters. For example, a velocity sensor might give out a steady voltage whose amplitude corresponds to speed. If the computer is to "know" what the speed is, the steady voltage must be translated into binary code by the A/D converter. Binary code is a sequence of "ones", or voltage pulses, and "zeroes" represented by the absence of a pulse. Conversely, if the computer directs a motor to run, a digital signal from the computer cannot be applied directly to the motor; it must be applied to a D/A converter, whose output may be applied to the motor or to a relay connected to the motor.

Digital signals are usually sent over a "data bus". Analog electricity is usually conducted by ordinary wires or cables.

Voice synthesis has recently been used when technicians are to be notified of conditions or given instructions. A voice is very effective for alarms, because it will simultaneously alert and inform a person, without regard for what direction the person gazes and without requiring that the person look anywhere. It also frees a worker free from having to look at printed instructions while working.

The prior art shows various applications of voice synthesis. A simple application of alarm-type voice notification is shown by Shibazaki et al. in U.S. Pat. No. 4,459,673. Their photocopier uses an artificial voice to tell the operator that the machine is out of paper or jammed. The voice merely serves as a display.

Jerome Lemelson and Christian Grund disclose in U.S. Pat. No. 4,563,770 an electrical multi-meter (combined volt, ohm and amp meter) which not only displays the electrical reading on a meter face, but also speaks the reading. The user need not look at the visual display while working on an electrical circuit. A voice synthesizer is used to generate the speech. In this invention also, the voice merely serves as a display.

U.S. Pat. No. 4,829,579 of Ryuzo Harada et al. shows a voice synthesizer attached to a chain saw. The artificial voice steps the user through a series of questions, such as, "Is there the fuel?" and "Is there the lubricating oil?" The user must push a yes button in response to each question before the saw will operate. A similar application is taught by Inoue et al. in U.S. Pat. No. 4,420,813 which vocalizes an automobile checklist. These are not trouble-shooting or diagnostic inventions, but rather normal operation checklists.

An electronic sewing machine with synthetic voice is described in U.S. Pat. No. 4,465,003 of Makabe et al. The voice describes the state of the machine.

Leonard, in U.S. Pat. No. 4,872,195, teaches the use of a voice synthesizer for a remote alarm unit. A user can telephone to the unit and receive a synthetic-voice report on the status of a transmitter at the remote location.

Walter Vogelsberg discloses electronic circuitry for generating a voice in his U.S. Pat. No. 4,519,027.

U.S. Pat. No. 4,821,217, issued to Brian Jackson and D. Wilson, describes an automatic test station, including a voice generator, for group testing of jet engines.

The Jackson test station includes a data acquisition computer. This computer serves basically as a switchboard and memory for the testing, allowing many jet engines to be tested in a group and saving time. It does not instruct the jet technician to perform tests according to a flowchart; it does, however, ask for instructions from the technician.

It will be appreciated that the prior art does not disclose any test unit which is adapted to trouble-shooting equipment which has both electro-mechanical parts and a control computer. Indeed, there is disclosed no prior invention which is even physically adapted for connection to a computer via a data bus, as well as for electrical connection to relays, switches, and the like.

SUMMARY OF THE INVENTION

The present invention overcomes the shortfalls of the prior art. It relates to a self-contained, portable unit for testing and diagnosing computer-controlled machinery such as an industrial sewing machine. The unit can be used by technicians who are not familiar with digital electronics or computer-controlled sewing machines.

The unit contains a CPU and digital memory. "CPU" stands for Central Processing Unit. The CPU, which may be a microprocessor, is usually supplied as a unit on a single electronic chip. The CPU is the circuit which conducts the computations of the unit. It retrieves stored data from the memory, sends and receives data to and from the outside, advances from one program step to the next, and decides where to go in the program flowchart.

The unit's CPU directs the testing via synthesized voice commands, which the technician hears over headphones plugged into the unit's headphone jack. Following the directions of the electronic voice, and using a voltage probe, the technician sequentially tests various parts of the sewing machine. The technician uses a keypad to relay information back to the CPU. The keypad responses are used by the CPU to negotiate the branches of a trouble-shooting flowchart previously written for the machine under test. The flowchart is encoded in the digital memory.

The keypad on the probe unit has push-buttons "YES", "NO", "GO" (continue onward), "BACKUP", and "REPEAT" by which the technician can respond to questions heard in the headphones or step through the testing sequence.

Besides the synthetic voice, the unit may include a visual line display for informing the technician about the test being performed, status of the system, or terminal locations.

To test a computer-controlled machine, such as an industrial sewing machine, the machine's control computer bus is first disconnected from the sewing machine and coupled to the tester which is coupled to the data bus. The output signals from the control computer are checked automatically by the unit by comparison to known expected signals stored in the tester memory. The tester may also be connected to various types of control computers through conventional communication ports.

To test the various devices, circuits, and sub-assemblies of the sewing machine, the unit sequentially directs the technician to place the probe at particular points, and automatically performs an appropriate test for that point. Because the control computer of the machine is being single-stepped by the tester during these tests, malfunctions of the control computer are not confused with malfunctions of the various devices, circuits, and sub-assemblies.

For example, the CPU may have the voice synthesizer tell the technician to place the probe on the output of a position sensor. The unit then automatically reads the voltage and compares it to specifications. If the sensor voltage is wrong, the technician may be told to replace the sensor. If the sensor output voltage is within specifications, the unit might next direct the technician to place the probe on the input to a stepper motor. With the probe on the stepper, the unit would automatically send a stepping pulse to the motor while asking the technician to see if it turns.

The structure of the machine under test determines the nature of the testing flowchart program encoded in the CPU memory. Various test programs may be written for a machine, but a program written for one machine will not, in general, work on a different machine. If a number of different machines are to be tested, either a test unit must be dedicated to each type of machine, or the flowchart program must be changed when switching machines. The present invention uses memory cards to hold the parts of the program which are specific to a machine.

The memory card is inserted into a memory card slot on the unit's case before testing a sewing machine. The card carries the test program for that type or model of sewing machine, and can be used to service all such machines. Alternatively, a memory card may be dedicated to a particular machine and used for trouble-shooting no other individual machine. In this case the memory card can also contain the repair and service history for that machine.

The CPU of the unit is centrally connected to all other external parts of the unit through appropriate interfaces. These interfaces may include: an A/D converter for turning voltages measured by the probe into digital code; a D/A converter for generating test voltages; a line display graphics interface; an RS232 serial communications port for coupling to the control computer; a memory card interface; and any needed additional interface (such as debouncing circuits for the keyboard).

The unit will include a data bus connector, or some other means of coupling the CPU to the control computer of the machine. This allows the control computer to be disconnected from the machine and coupled to the CPU during the test.

The program outputs the messages in ASCII code; the output of the line display is alphanumeric, and the output of the speech synthesizer is analog signals.

After asking a question of the technician, the unit will wait for a set time. If the technician does not respond, then the unit will provide additional information to the technician.

DETAILED DESCRIPTION OF THE BEST MODE OF THE INVENTION

Figure 1:
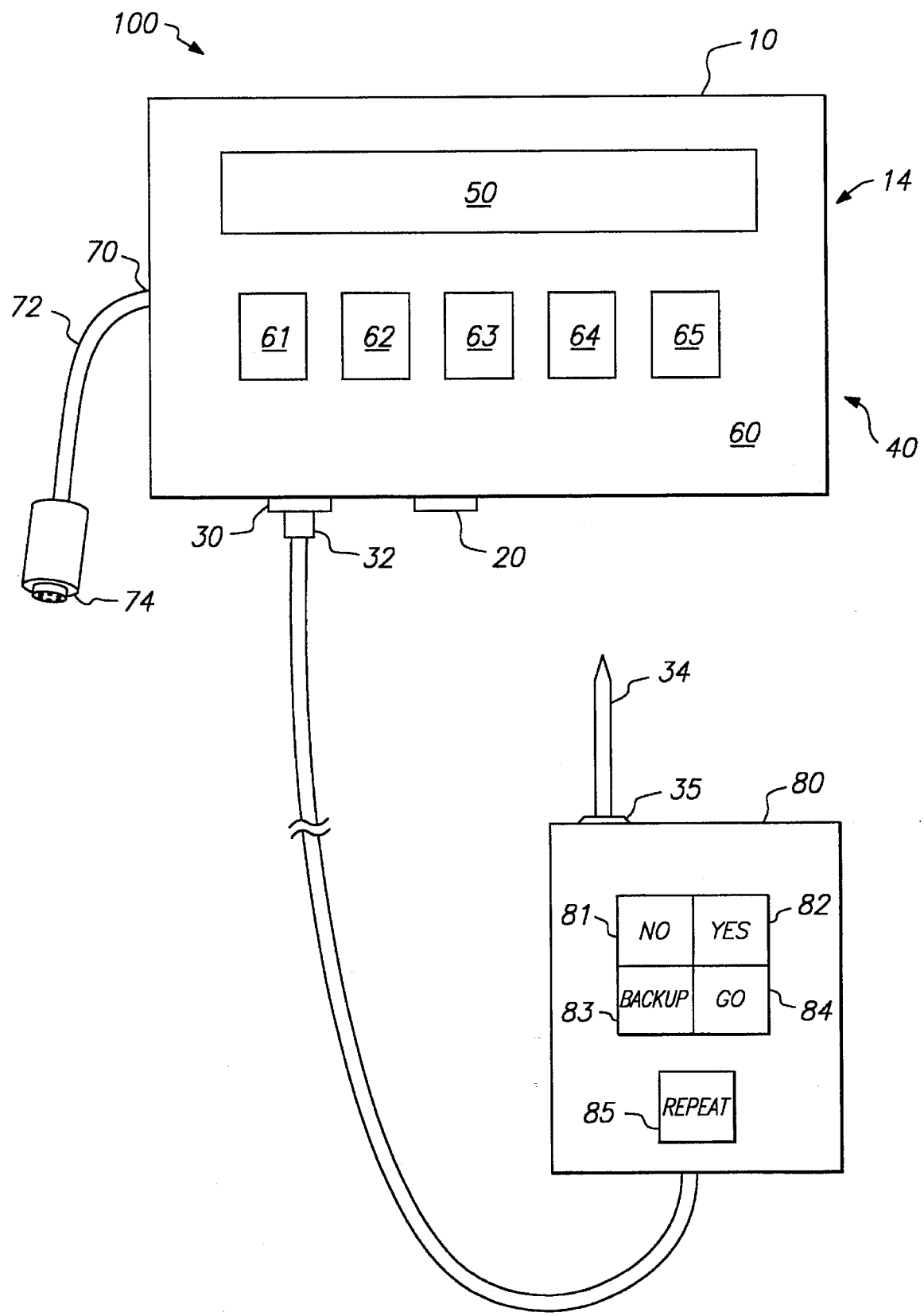
FIG. 1 is a perspective view of the unit of the present invention and accessories which may be used with it.

The unit 100 of the present invention is shown in FIG. 1 along with accessories. The unit is housed in a case 10 which is about the size of a conventional personal book of checks. A belt clip (not shown) may also be included if desired.

The outside of the case 10 has a head phone jack 20, a signal probe unit jack 30, a memory card slot 40, a two-line text display 50, a keypad 60 with five momentary-contact push-buttons or keys 61–65, and an RS232 jack 70 on the rear panel of the case 10. The jack 70 accepts an RS232 plug 74 connected to a serial data bus 72. The data bus 72 carries digital signals for communication between the control computer of the machine under test and the CPU of the unit 100. ("CPU" stands for Central Processing Unit, the controlling circuit; for example, a microprocessor.)

A probe unit 80 has a plug 32 which is insertable into the probe unit jack 30. The probe unit 80 has a probe jack 35 where a probe 34 is inserted. The probe may be conventional, with a sharp metal spike and insulated handle. A flexible wire connects the probe unit 80 to the plug 32, which mates with the probe unit jack 30 in the unit case 10. A conventional headphone or headset including a plug can be inserted into the phone jack 20 on the case 10. The head phone jack 20 may also be connected to a loudspeaker, earplug, or other audio transducer.

A memory card is insertable into the slot 40 on the side of the case 10. The memory card has conductive fingers which mate with conductive elements inside the card slot 40.

An electrical connector 14 is provided at the rear of the housing 10 for powering the unit 100. The unit 100 may also utilize batteries, or any other conventional power source or combination of sources. A power on/off switch may be provided as one of the keys 61–65.

The unit 100 and the accessories are used to test, diagnose or trouble-shoot machines which are electro-mechanical in nature, and which include a control computer which directs or controls some actions of the devices. The preferred embodiment of the invention is applied to the testing of computer-controlled industrial sewing machines, but the invention may be applied to other sorts of machines without any modification (except to the trouble-shooting program).

The probe unit 80 is of the size to fit into a user's hand. The probe unit 80 includes five buttons 81–85 which are used by the user to respond to instructions from the test program. The user can use the "NO" key 81 and the "YES" key 82 to respond to questions asked by the test program. The "BACKUP", "GO" and "REPEAT" keys 83,84,85 can be used by the user to scroll through the test program as desired.

Figure 2:
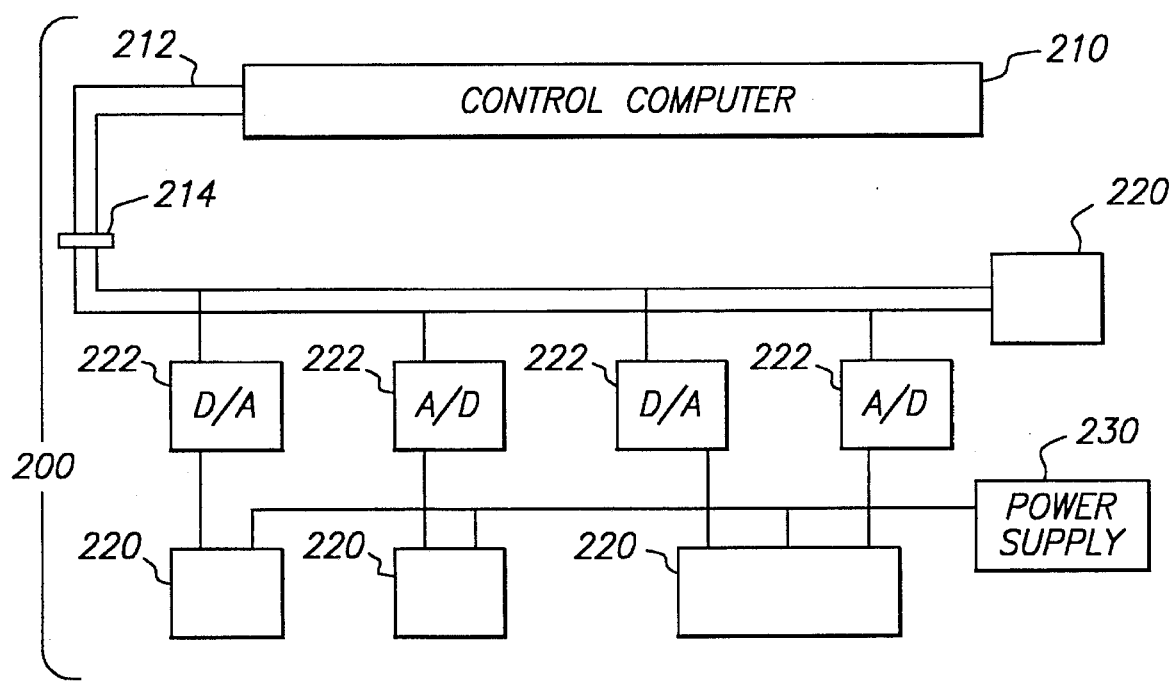
FIG. 2 is a schematic block diagram of a computer-controlled machine which may be tested by the present invention.

A machine 200, to be tested by the present invention, is shown schematically in FIG. 2. The machine 200 includes a control computer 210, a data bus 212, a data bus connector 214, and various devices 220. The data bus 212 is coupled to the various devices 220 so that the control computer 210 can communicate data with all those devices 220 under its control. A power supply 230 powers the electrical and electronic circuits.

Several of the devices 220 under the control of the computer 210 are associated with D/A or A/D converters 222. These inter-convert the digital signals of the computer 210 and the voltages or currents associated with the devices 220.

The use of the invention to trouble-shoot the machine 200 generally involves disabling the control computer program 210 for the machine 200 under test. The machine under test then operates under control of the tester. This isolates the control computer 210 from the devices 220 and makes it possible to test them individually or as grouped sub-assemblies. In one application the data bus connector 214 is opened before testing is begun.

Figure 3:
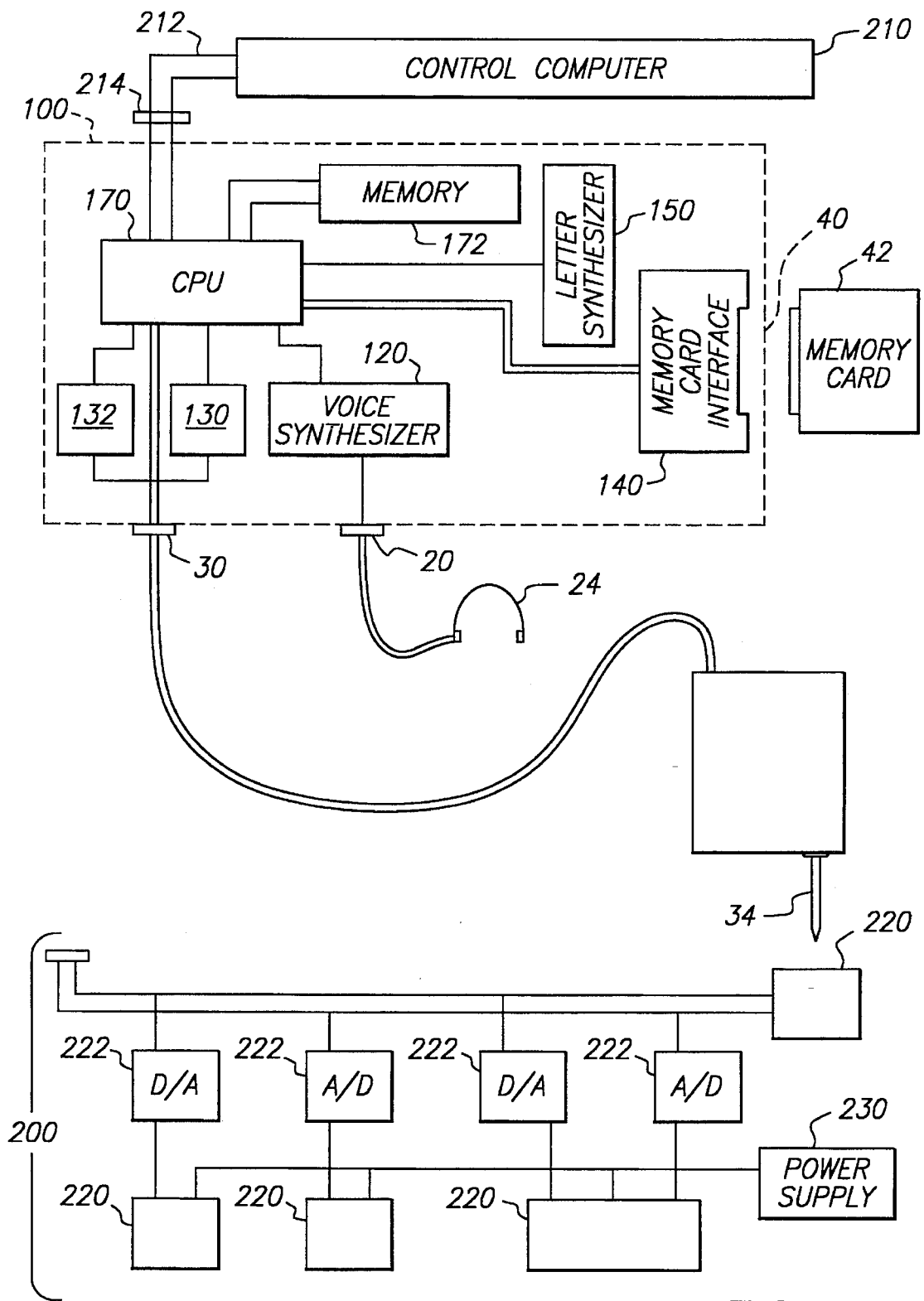
FIG. 3 is a schematic block diagram of the invention interconnected with the machine, showing the flow of control or information.

Referring now to FIG. 3, the unit 100 (or, the case 10) is indicated by a dashed-line box. The RS232 data bus 72, plugged into the jack 70 of the unit 100 case 10, is at its other end mated with the data bus connector 214. When this connection is made the control computer 210 is coupled directly to the CPU 170 of the unit 100.

The present invention is not limited to any particular type of data bus or connection method. Parallel as well as serial buses can be used, and no particular plug, jack, connector, or other coupling method is needed to practice the invention.

The CPU 170 controls and directs the testing (trouble-shooting) according to a flowchart encoded in a digital program. The CPU samples voltages or measurements through the tip of the probe 34, or generates voltages there; the CPU receives information from the user via the keypad containing the keys 81–85, and instructs the user via the voice synthesizer 120 and the headphones 24.

It is to be noted that the control computer 210 of the machine 200 may also contain a central processing unit, but unless otherwise stated, the term "CPU" in the following specification and claims will refer to the CPU 170 of the test unit 100 of the present invention. The term "computer" is reserved to the machine 200, even though it may incorporate a microprocessor or the like.

During testing the only electrical link between the control computer 210 and the devices 220 is through the unit 100, probe unit jack 30, and probe 34. The probe 34 is placed by the user (not shown) onto various electrical connection points of the machine 200 to make the connection continuous. When the control computer itself is suspect, the unit 100 data bus can be connected to the machine directly.

Digitally-encoded messages are sent from the CPU 170 to the voice synthesizer 120, which converts the digitally-encoded data into intermediate message signals, taking the form of time-varying voltages. Such synthesizers are commercially available. The analog voltage signal is amplified if necessary and then applied to the headphones 24 worn by the user. Another transducer, such as a loudspeaker, could be substituted.

The line display 50, seen in FIG. 1, is used in conjunction with the headphones to additionally communicate from the CPU 170 to the user. The line display may describe the test being performed, the location of an electrical terminal, or a status report.

Line display messages from the CPU 170 are sent to the letter synthesizer 150 which turns binary code into signals which activate the display 50 to show letters. The display 50 may be an LCD screen such as is used in pocket calculators and in watches, or any other type of electrical-to-visual transducer.

Any other synthesizer-transducer pair is within the scope of the present invention and the following claims: for example, a picture screen (such as a CRT or LCD screen) to form images from digital data stored by the memory 172 or memory card 42. The synthesizer and the transducer will often be available commercially as a combined unit. They may also be integrated in the design so that there is not an immediately apparent distinction between them. However, in these cases the synthesizer and the transducer remain independent in function and internal structure. The synthesizer converts digital signals from the CPU into other signals in an intermediate format; the transducer presents those intermediate forms as sensory information appreciable by the user, such as character writing, pictures, or sounds.

To run the test program requires that the tester receive information so that the data bus is bi-directional; the user needs to communicate with the CPU 170 in order to respond to the CPU's requests, instructions and questions. The keypad 60 is used for this in the preferred embodiment of the invention.

The five keys 81–85 included on the probe unit 80, shown in FIG. 1, are labelled "YES", "NO", "BACKUP", "GO", and "REPEAT". The user uses the "YES" or "NO" keys to answer questions about the state of a device 220. The other three keys allow the user to move through the test program as desired.

The "REPEAT" key 85 is used to repeat a test step. This might be used if the user realizes that a test has been done wrongly. At certain points in the flowchart, the program will wait for the user before proceeding. At these points the "GO" key 84 is used to advance to the next program test step. The CPU will ask the user if it should proceed, and not go ahead unless the "GO" key has been depressed.

The testing program may include a maximum period of waiting for a response from the user, after which the CPU sends out another message. The message may explain more, on the assumption that the user is confused.

Other user response means, besides a keypad, are within the scope of the invention. For instance, an electronic notepad, a mouse or joystick, or a voice analyzer could also be used for the user to communicate with the CPU 170.

The CPU 170 must be loaded with the test program (which incorporates the trouble-shooting flowchart) before the unit will work. To load, the user inserts the memory card 42, which holds the test program, into the slot 40 of the unit 100. An interface 140 couples the card 42 to the CPU 170. The test program, designed to run on the CPU 170, will ordinarily be written in digital code. It directs the trouble-shooting of the machine's 200 computer 210, computer 210 program, and various other devices 220.

The card 42 has memory chips (or other types of memory) which can contain the trouble-shooting program. The card's memory may also be used to contain information about a particular machine, to which that card is dedicated. The card might hold identification data, notes, and a repair history of the machine. Because the notes cannot be entered via the five-button keypad, another interface and a full keyboard must be used for this function. When the user desires to enter notes or information an interface allows the card to be programmed by any terminal or computer with an RS-232 or parallel port.

The unit 100 may also contain a permanent memory 172. This memory 172 could hold a flowchart outline, instructions on loading the memory card 42, and so on, as well as the trouble-shooting program itself; if the test program is permanently stored in memory 172, no loading is needed.

With the card 42 program loaded through the slot 40 and the CPU 170 connected to the control computer, the testing is ready to begin. The user dons the headphones 24. The user then flips a switch on the machine that puts the machine into the "test" mode. The test program first causes the CPU 170 to read the signals coming from the control computer. Either the CPU 170 will prompt the computer 210 to start its program, or the user will be instructed to enable the control computer directly.

The instructions to the user are stored in the memory card 42. These messages are loaded as part of the test program, and are sent by the CPU 170 from the memory to the voice synthesizer 120 when the test program so directs. The voice synthesizer 120 is conventional. It turns the digitally-encoded messages from the memory into intermediate message signals which, in the case of the voice synthesizer, are analog voltage signals which are coupled to the headphones 24. The headphones 24 act as transducers to convert the voltage signals into the sound of a synthetic voice, which the user's senses can detect. The synthetic voice may direct the user. It may ask questions, inform the user of something, or send him or her any sort of message.

The various devices 220 of the machine 200 are tested either individually or as grouped sub-assemblies. One class of devices 220 is input devices, including photocells, limit switches, encoder inputs, and other signal inputs. These send information about conditions in the machine 200 to the control computer 210.

In troubleshooting this class of devices 220, a typical procedure according to the flowchart of the test program might be as follows: The user is instructed by the tester to place an object in front of the detector, manipulate it, or otherwise to perform a set of operations which normally causes a certain voltage signal from the input device 220. The user is also instructed to place the tip of the probe 34 onto an electrical connection point where the voltage signal can be measured. Such a point might be, for example, a bare terminal where a wire attaches to a photocell.

While measuring the voltage at any connective point of the machine 200, the sampled voltage is conveyed by the conductive lead wire of the probe 34 to an A/D converter 130 housed in the unit 100 case 10, which converts the voltage to a digitally-encoded amplitude. The converted digital amplitude signal can be "read" by the CPU 170 and compared to parameters in the program, which are also stored as binary data.

If a device 220 itself puts out suitable binary signals, then no A/D converter is needed, and the probe 34 serves as a logic probe directly connected to the CPU.

The terms "A/D converter" and "D/A converter" here and in the following claims include both the usual devices of those names which transform between an analog signal and binary code, and also other circuits which perform the same function. One example of such a circuit would be one which changes a voltage into a string of digital pulses at a frequency which is a function of the steady voltage amplitude. The string of pulses can be counted by the CPU over a fixed interval, and the count used as a measure of the voltage. Other conversion means will suggest themselves to those skilled in the art.

The provision of an A/D converter 130 within the unit 100 does away with the need for the user to read the voltage displayed by a voltmeter or, the need to listen to a synthetic voice stating the voltage. This simplifies the user's job and also avoids user errors.

If the voltage amplitude is not within specifications, then the user is instructed to place the voltage probe 34 onto another point, where the powering voltage from the power supply 230 to the detector device 220 can be sampled. The CPU will inform the user whether the power supply voltage is proper. The CPU may instruct the user to replace the device 220 if the tests indicate that it is defective.

For checking an output device such as a solenoid valve, stepper motor, relay, or signal output, the CPU might first instruct the user to place the probe 34 onto a connective point at which the power supply 230 voltage can be measured. It would tell the user to place the probe 34 onto a connective point to sample the voltage signal that controls the device 220. The CPU would ask the user to observe the device 220 while it activates the device, for example by toggling the control voltage on and off, simultaneously telling the user when it is toggled on and off; it would then ask for a user response. The user depresses the NO or YES keys 81,82 to respond. If the CPU decides the device 220 is defective, it will instruct the user to replace it.

To toggle an output device as discussed above, the CPU will send an amplitude command (binary-coded digital signal) to a D/A converter 132 which is, like the A/D converter 130, connected to the probe unit jack 30. The command causes the D/A converter to put out a certain test voltage. The generated test voltage is conveyed along the conductive path to the tip of the probe 34.

A series of binary numbers stored in the memory can be converted into a time series of voltages at the probe 34 tip by the above method. As a result, the CPU 170 is capable of generating any signal, such as a pulse or sine wave, which might be needed to control a device 220.

The user may also be asked to perform a purely mechanical test, such as trying a clutch, brake, or switch for free movement.

As the testing progresses, the flowchart of the trouble-shooting program being run by the CPU is negotiated by steps and branch points. The CPU will make decisions about branching, as discussed above. The user will ordinarily not make branching decisions directly, but will answer questions which result in branch decisions.

It will be seen that the present invention, as described above in a particular embodiment, allows trouble-shooting of a wide variety of electro-mechanical, computer-controlled machines by users who may be unfamiliar with either computers, the program of the control computer 210, or the particular machine devices 220 that are to be tested.

By directly coupling the control computer 210 of the machine 200 to the CPU 170 of the testing unit 100, the present invention minimizes the need for the user to deal with digital electronics. By coupling the electrical probe 34 directly to the CPU 170, the present invention minimizes decision-making and human error by the user, and does away with the need for the user to carry a voltmeter.

By using synthetic voice, the present invention eliminates the need for a user to carry a bulky manual, turn away from his or her work to consult a written page, or find the room on a factory floor to spread out a circuit diagram. Manuals or diagrams need not be stored.

By using interchangeable memory cards 42, the present invention allows a single unit 100 to be easily, quickly and inexpensively applied to trouble-shoot almost any machine. The memory card for any machine 200 may be kept at the machine location so that no library is needed for the cards.

It is to be noted that the following definitions are to be applied to the terminology of the present invention's Claims, infra. It is also to be noted that any listing in the following paragraph preceding the Claims is exemplary only, and is not exclusive of other, unlisted things which would fall under the preceding definition in a paragraph.

"Data bus" means any apparatus for transmitting digital signals, such as a serial or parallel port; electrical cable, wire or connector; light-conductive fiber or light beam; radio link, etc.

"Data bus connector" means any apparatus or method for coupling to a data bus for digital communication via the data bus.

"CPU" means a digital circuit or apparatus which can execute a program stored in digital format or transmitted to the circuit or apparatus in digital format.

"Probe means" is hereby defined to be anything which can electrically connect to: a device 220; an electrical connection to a device 220; or any other electrically conductive connective point of the machine 200, including a ground point. Under this definition, the pointed tip of an ordinary voltage probe as disclosed above (probe 34), an alligator clip, a screw-on or push-on terminal, a plug, jack, data bus connector, etc., are all probe means.

"Voltage means" includes anything which generates, detects, or transmits a voltage or a voltage measurement.

"Transducer means" is hereby defined to mean either a transducer(s), or apparatus for coupling to a transducer(s). For example, the headphone jack 20, while not a transducer proper, is a means for coupling the unit 100 to a transducer (the earphone of the headphone set 24) and so is a transducer means within this definition.

"Response means" includes any method or apparatus which allows the user of the unit 100 to cause a digital signal to go to the CPU.

"Digital memory means" is hereby defined to be a memory device, such as a magnetic disc drive, a laser disc, RAM, ROM, a memory card, a register, or any other digital storage which may hold a program and be either read to or read from.

In general, it is to be understood that the present invention is not limited to the particular embodiments described above, but encompasses all within the scope of the following claims.

What is claimed is:

1. A hand-held tester for allowing a user to test an electro-mechanical machine comprising:
   a. a housing having dimensions and weight sufficiently small to be conveniently carried by the user;
   b. a probe means extending from said housing for isolating specific components of the machine by selectively coupling the tester to a plurality of selectable test points on the machine for providing an electrical interface to the machine or to said specific components;
   c. means for providing data to the machine in order to simulate different conditions;
   d. means for providing an analog voltage signal for stimulating an electro-mechanical response from the machine;
   e. a sensing means for sensing data from the machine; and
   f. a fault pinpointing means coupled to the sensing means comprising:
      (1) means for providing a test instruction/query to the user for prompting the user to couple said probe means to test points on the machine;
      (2) means for receiving a user response to the instruction/query; and
      (3) means for providing a subsequent instruction/query according to a troubleshooting flowchart for guiding the user through the flowchart in order to identify anomalous conditions,
   whereby a user of any skill level can use said tester, and by responding to each test instruction/query can pinpoint faults in the machine.

2. The tester according to claim 1, wherein the means for providing a test instruction/query includes a multi-line text display.

3. The tester according to claim 1, wherein the means for providing a test instruction/query generates voice messages.

4. The tester according to claim 3, wherein the means for providing a test instruction/query includes a phone jack.

5. The tester according to claim 3, wherein the means for providing a test instruction/query includes a headphone.

6. The tester according to claim 1, wherein the machine is a sewing machine.

7. The tester according to claim 1, wherein the sensing means includes voltage measuring means for converting a sampled voltage into a digitally-encoded amplitude to be sent to the fault pinpointing means.

8. The tester according to claim 1, wherein the means for providing an analog voltage signal includes voltage generating means for converting a digital amplitude command from the fault pinpointing means into the analog voltage signal.

9. The tester according to claim 1, further comprising a test program to direct the fault pinpointing means.

10. The tester according to claim 9, wherein the test program executes a first sequence of tests on a computer of the machine and the test program executes a second sequence of tests on an electro-mechanical device of the machine, the second sequence including voice messages to the user provided by the means for providing a test instruction/query.

11. The tester according to claim 10, including card means for accepting a memory card wherein the memory card holds the test program.

12. The tester according to claim 10, wherein the means for providing a test instruction/query sends the user additional messages if the user does not activate the means for receiving a user response within a certain time following one of the voice messages.

13. A portable unit coupleable in series between an electro-mechanical assembly of a machine under test and a computer of the machine under test, the unit comprising:
   a. a housing of a size and weight to be conveniently carried by a user;
   b. a CPU mounted in said housing and having means for interfacing with the computer of the machine under test;
   c. a single electrical probe extending from said housing for isolating specific components of the machine under test by alternatively coupling the unit to one of a plurality of preselected electrical connective points of the machine under test according to instructions from the CPU;
   d. a volt meter mounted in said housing for sending digital voltage information to the CPU, the volt meter coupled to the probe for sampling voltages at the connective points;
   e. a voltage generator mounted in said housing for sending a voltage signal to the electro-mechanical assembly of the machine under test, the voltage generator coupled to the probe for providing a test voltage to the connective points;
   f. a voice synthesizer mounted in said housing for converting digitally-encoded messages from the CPU into audible speech for instructing, for informing, and for questioning a user concerning a current test step; and
   g. memory means for storing a digitally-encoded test program coupled to the CPU which enable the CPU to direct the user to contact said electrical connective points with said probe or respond to queries in order to locate a fault in the machine under test according to a troubleshooting flowchart,
   whereby a lesser skilled technician can use said unit and by responding to each instruction and question can pinpoint faults in the machine under test.

14. The unit according to claim 13, further comprising a keypad for the user to communicate digital responses to the CPU.

15. The unit according to claim 13, wherein the voltage generator comprises means for converting a digital amplitude command from the CPU into the test voltage.

16. The unit according to claim 13, wherein the machine under test is a sewing machine.

17. The unit according to claim 13 wherein the memory means is a removable magnetic card and the test program contained therein is specific to a particular type of machine.

18. A portable unit connectable in series between an electro-mechanical assembly of a machine under test and a computer of the machine under test, for use by a technician of any skill level, the unit comprising:
   a. a CPU having means for digitally interfacing with the computer of the machine under test;
   b. a single electrical probe for isolating specific components of the machine under test by alternatively coupling the unit to one of a plurality of electrical connective points of the machine under test according to instructions from the CPU;
   c. a volt meter operatively coupled to the CPU for sending digital voltage information to the CPU, the volt meter coupled to the probe for sampling voltages at the connective points;
   d. a voltage generator for sending a voltage signal to the electro-mechanical assembly of the machine under test, the voltage generator coupled to the probe for providing a test voltage to the connective points;

e. a voice synthesizer for converting digitally-encoded messages from the CPU into speech for instructing, for informing, and for questioning a user concerning a current test step;

f. a user communications means for communicating digital responses from the user to the CPU; and g. digital memory means for holding a digitally-encoded test program to be run by the CPU for directing the user in locating a fault in the machine under test according to a troubleshooting flowchart, whereby said unit has a size and weight which enables it to be conveniently carried by a user and whereby a technician of any skill level can use said unit and by responding to each instruction and question can pinpoint faults in the machine under test.

19. The unit according to claim 18, wherein the voltage generator comprises means for converting a digital amplitude command from the CPU into the test voltage.

20. The unit according to claim 17, wherein the machine under test is a sewing machine.

21. The unit according to claim 18, including headphones coupled to the voice synthesizer.

* * * * *